(12) United States Patent
Taussig

(10) Patent No.: US 7,195,950 B2
(45) Date of Patent: *Mar. 27, 2007

(54) FORMING A PLURALITY OF THIN-FILM DEVICES

(75) Inventor: Carl Philip Taussig, Redwood City, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 90 days.

This patent is subject to a terminal disclaimer.

(21) Appl. No.: 10/895,584

(22) Filed: Jul. 21, 2004

(65) Prior Publication Data

US 2006/0019504 A1    Jan. 26, 2006

(51) Int. Cl.
*H01L 21/44* (2006.01)

(52) U.S. Cl. .............. 438/100; 438/946; 148/DIG. 164

(58) Field of Classification Search ................ 438/100, 438/946; 148/DIG. 164
See application file for complete search history.

(56) References Cited

U.S. PATENT DOCUMENTS

| | | | |
|---|---|---|---|
| 6,586,327 B2 | 7/2003 | Shepard | |
| 6,599,796 B2* | 7/2003 | Mei et al. | 438/243 |
| 6,646,912 B2* | 11/2003 | Hurst et al. | 365/175 |
| 6,861,365 B2* | 3/2005 | Taussig et al. | 438/725 |
| 2002/0132482 A1* | 9/2002 | Chou | 438/692 |
| 2005/0170639 A1* | 8/2005 | Mei | 438/631 |
| 2005/0176182 A1* | 8/2005 | Me et al. | 438/149 |

* cited by examiner

*Primary Examiner*—Trung Dang

(57) ABSTRACT

An aspect of the present invention is a method for forming a plurality of thin-film devices. The method includes coarsely patterning at least one thin-film material on a flexible substrate and forming a plurality of thin-film elements on the flexible substrate with a self-aligned imprint lithography (SAIL) process.

18 Claims, 14 Drawing Sheets

FORMING A PLURALITY OF THIN-FILM DEVICES

FIELD OF THE INVENTION

The present invention relates generally to the field of semiconductor devices and more particularly to a method and system for forming a plurality of thin-film devices.

BACKGROUND OF THE INVENTION

In the semiconductor processing industry, there is currently a strong trend toward scaling down existing structures and fabricating smaller structures. This process is commonly referred to as microfabrication. One area in which microfabrication has had a significant impact is in the microelectronic area. In particular, the scaling down of microelectronic structures is allowing the structures to be less expensive, have higher performance, exhibit reduced power consumption, and contain more components for a given dimension. Although microfabrication has been widely active in the electronics industry, it has also been applied to other applications such as biotechnology, optics, mechanical systems, sensing devices and reactors.

Microfabrication can be employed to fabricate permanent inexpensive rugged memory (PIRM) arrays. PIRM is an extremely low cost archival solid-state memory for digital photography, digital audio and other applications. From a fabrication perspective, PIRM includes a series of semiconductor and other thin-films sandwiched between a patterned top metal layer and a patterned bottom metal layer. Where these metal layers cross forms a two-port device. Imprint lithography is one type of fabrication method that is utilized fabricate these arrays.

Imprint lithography is typically utilized to pattern thin films on a substrate material with high resolution using contact between a master with the features of the structure to be fabricated and the substrate material to be patterned. The thin films patterned can be dielectrics, semiconductors, metals or organic and can be patterned as thin films or individual layers. Imprint lithography is particularly useful in roll-to-roll processing since it has a higher throughput, can handle wide substrates, and does not rely on optical flatness of the substrate to provide high resolution. However, the limitation of this implementation is related to the fact that in order to create the lexicon of two-port devices in the PIRM structure, an embossed mask with as many as seven discrete heights is needed. Consequently, an embossed mask with this number of heights puts a larger burden on the mask mastering, etching and imprinting processes.

Accordingly, what is needed is a method and system for fabricating a plurality of thin-film devices that overcomes the above referenced problems related to the PIRM fabrication process. The method and system should be simple, inexpensive and capable of being easily adapted to existing technology. The present invention addresses these needs.

SUMMARY OF THE INVENTION

An aspect of the present invention is a method for forming a plurality of thin-film devices. The method includes patterning at least one material on a flexible substrate in a coarse fashion and forming a plurality of thin-film elements on the flexible substrate with a self-aligned imprint lithography (SAIL) process.

Other aspects and advantages of the present invention will become apparent from the following detailed description, taken in conjunction with the accompanying drawings, illustrating by way of example the principles of the invention.

DETAILED DESCRIPTION

Figure 1:
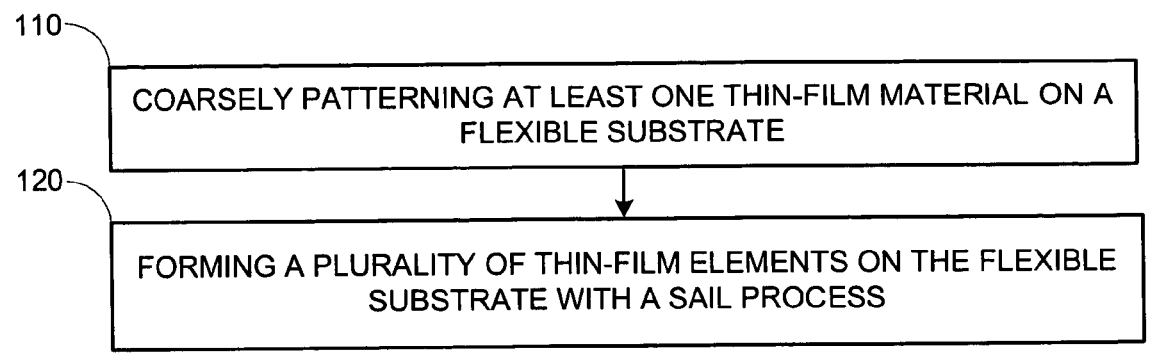
FIG. 1 is a high level flow chart of a method of forming a semiconductor device in accordance with an embodiment of the present invention.

The present invention relates to a method and system for forming a plurality of thin-film elements. The following description is presented to enable one of ordinary skill in the art to make and use the invention and is provided in the context of a patent application and its requirements. Various modifications to the embodiments and the generic principles and features described herein will be readily apparent to those skilled in the art. Thus, the present invention is not intended to be limited to the embodiment shown but is to be accorded the widest scope consistent with the principles and features described herein.

As shown in the drawings for purposes of illustration, a method and system for forming a semiconductor device is disclosed. Varying embodiments of the method and system provide a coarse patterning step to be utilized in conjunction with a self-aligned imprint lithography (SAIL) process in order to form a plurality of thin-film elements on a flexible substrate. Consequently, full electrical isolation of the thin-film elements is achieved regardless of the structures thereof. Additionally, by providing a coarse patterning step in conjunction with the SAIL process, the number of discrete heights employed by the associated embossing mask can be significantly reduced thereby reducing the number of mask mastering and etching steps in the overall process.

The conventional process has two main drawbacks that are addressed by the disclosed embodiments. First, the conventional SAIL process relied on using an intrinsic amorphous Si layer in the diode to provide electrical isolation between adjacent elements in the PIRM array. This becomes problematic if the memory cell contains a metallic barrier layer. Utilizing the disclosed embodiments, full electrical isolation of the crosspoint elements is provided regardless of the structure the crosspoint elements.

The second drawback of the conventional process is that the process requires the application of a Plasma Enhanced Chemical Vapor Deposition (PECVD) silicon layer on top of the embossed polymer mask. The temperature of this deposition is 250 C. Because of this high temperature, the mask materials that can be used for the SAIL process is limited. By employing the disclosed embodiments, all of the PECVD processes can be performed before any of the embossed lithography processes. Only the top metal deposition, a room temperature operation, is applied to the embossed polymer mask. This allows for the use of mask materials with low temperature ceilings and allows all of the critical layers to be deposited in sequence without being exposed to the ambient temperature surroundings.

FIG. 1 is a high level flow chart of a method of forming a semiconductor device. A first step 110 includes patterning at least one material on a flexible substrate in a coarse fashion. In an embodiment, this step includes patterning several thin-film layers. A final step 120 includes forming a plurality of thin-film elements on the flexible substrate with a SAIL process.

Although the above-described concept is disclosed in the context of being utilized in conjunction with a flexible substrate, it should be noted that the process could also be implemented in conjunction with a non-flexible substrate.

The disclosed embodiments are possible because the layout of the PIRM circuitry is repetitive. Accordingly, in an embodiment, the PIRM circuit can be divided into a repeated pattern of three regions: one containing only switch-diode memory cells, one with only diodes and crossovers, and one with only vias and insulated cross-overs. If a coarse pre-patterning of the substrate is made whereby the pattern corresponds to the aforementioned three regions, the complexity of the performance of a subsequent SAIL process is substantially reduced.

Figure 2:
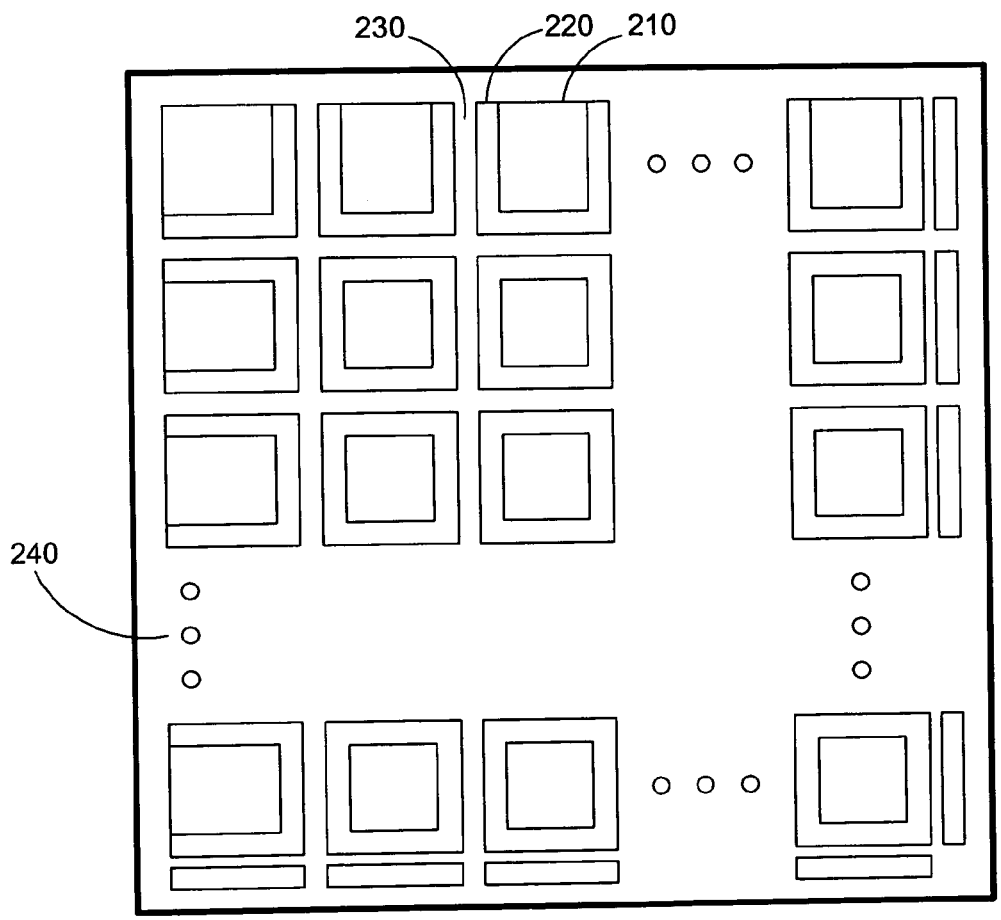
FIG. 2 shows a plan view of the coarsely patterned primary thin films defining three regions in accordance with an embodiment of the present invention.

FIG. 2 shows a cross-section of a structure that shows the repeated pattern of these three regions. The structure 200 includes a memory cell region 210, a diode region 220, and a via region 230. A bottom metal 240 is also shown. The via region 230 includes only the bottom metal 240. The diode region 220 includes a diode layer on top of the bottom metal 240. In an embodiment, the diode layer is a PIN thin film silicon structure. The memory cell region 210 includes the bottom metal 240 covered by a diode layer and switch layer. In an embodiment, the switch layer is an amorphous silicon antifuse or a polymer fuse material.

Figure 3:
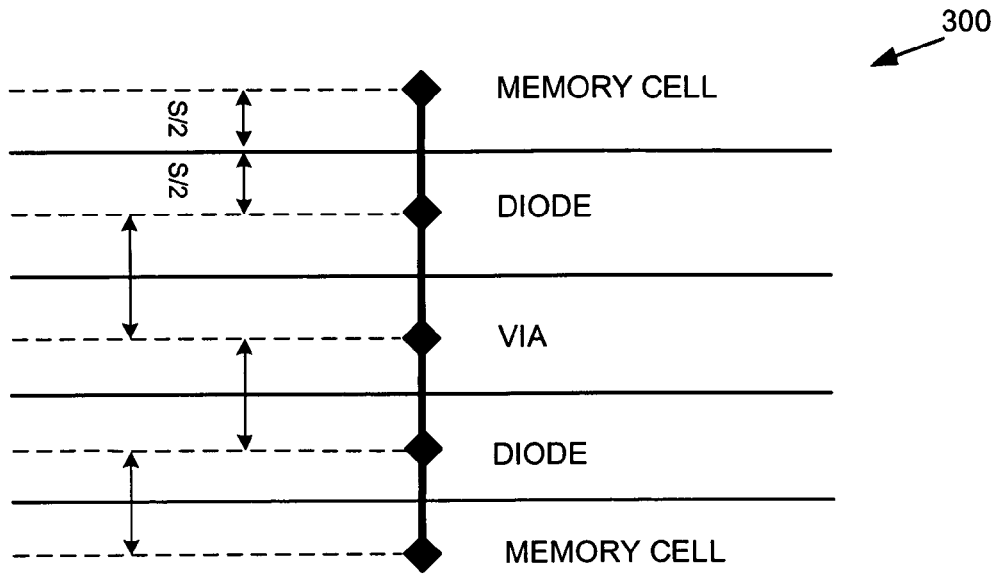
FIG. 3 shows the fraction of the die that is consumed by these regions as function of the alignment and patterning tolerances.

It should be noted that for performance and reliability reasons, each PIRM layer is subdivided into between 10 and 1000 sections that contain the three regions 210, 220, 230. The minimum width of the diode and via regions 220, 230 in each section is limited by the alignment and patterning tolerances between the coarsely patterned regions and the subsequent polymer mask that is embossed on top of the regions. FIG. 3 shows the fraction of the die that is consumed by these regions as function of the alignment and patterning tolerances. As can be seen in FIG. 3, a tolerance of +/−S/2 on the boundaries between each of three regions 210, 220, 230, where S is the total registration error resulting from all sources: misalignment, substrate distortion, over/under etch, over/under exposure etc. and determines the minimum width of each region. Consequently, if the regions were any narrower, a via might become a diode or a diode might become a memory cell.

Figure 4:
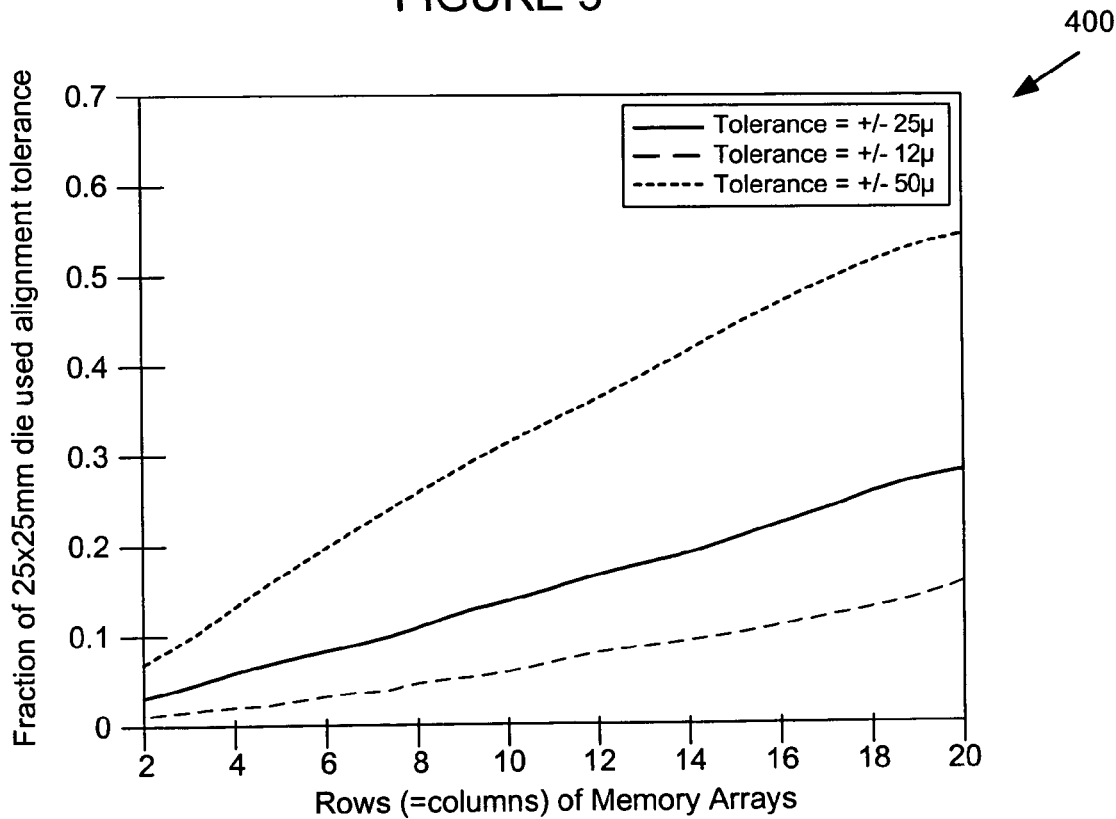
FIG. 4 is a graph that shows the relationship between the number of sections on the die, the alignment tolerance and the amount of the die available for memory.

Additionally, FIG. 4 is a graph that shows the relationship between the number of sections on the die, the alignment tolerance and the amount of the die available for memory. In general, a larger the number of sections and poorer alignment results in less die area being available for memory. For example, if 100 sections (10 rows and 10 columns) are employed with an alignment tolerance of +/−50µ, then roughly 30% of a 25×25 mm die will be unavailable for memory. For the purposes of this patent application, "coarsely patterned" is between 10 and 50 microns wherein 25 u represents a reasonable compromise between active area lost to alignment tolerances and cost of process required to provide alignment with that accuracy.

In an embodiment, step 110 is accomplished with an additive process e.g. shadow masking techniques. With shadow masking, a physical mask (shadow mask) made from a flexible film such as a thin metal foil or plastic sheet is placed directly over the substrate. The mask has apertures that correspond to locations where material is to be deposited on the substrate. In all other regions, the shadow mask physically blocks the deposition material. After some period of usage, the mask must be cleaned of the built up material or discarded.

In another embodiment, step 110 is accomplished with a subtractive process. In this embodiment all of the device layers up to the top metal layer are deposited as continuous blankets wherein patterning the continuous films into the regions depicted in FIG. 2 is accomplished using etching processes. Because of the relatively large size of the regions, the masks for the etch process may be applied with screen printing or roll-to-roll photolithography.

Although additive and subtractive processes are described in conjunction with the above-disclosed embodiments, one of ordinary skill in the art will readily recognize that a variety of different processes such as inkjet printing, could be employed to coarsely pattern the thin-film layers.

As previously described, self-aligned imprint lithography (SAIL) is a process for patterning thin films on a substrate material with high resolution by molding a 3D polymer mask onto the coated substrate using a compliant stamp. The thin films patterned can be dielectrics, semiconductors, metals or organic and can be patterned as thin film stacks or individual layers. Imprint lithography is particularly useful in roll-to-roll processing since it has a higher throughput, can handle wider substrates and tolerates a non-planar substrate.

Figure 5:
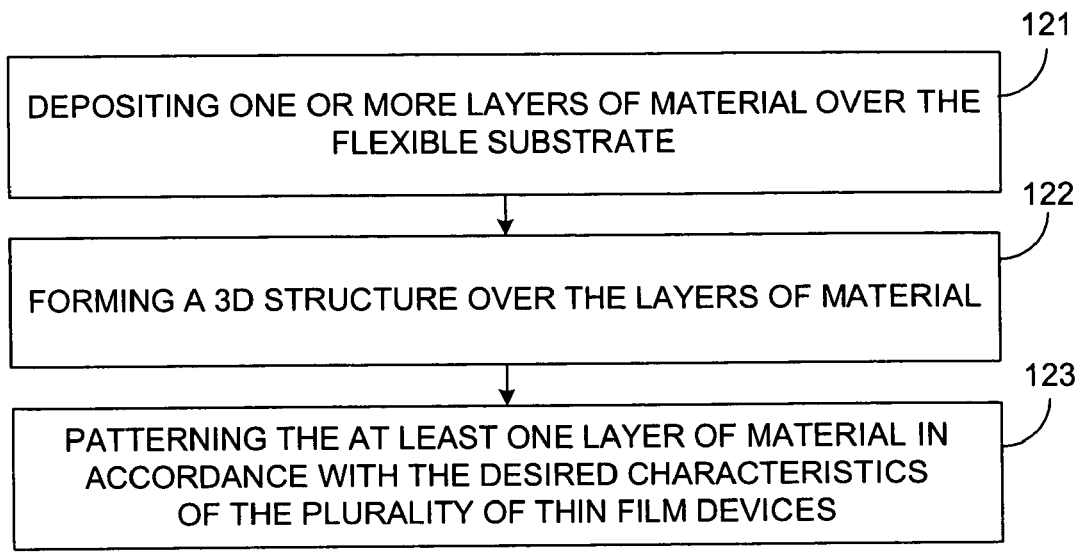
FIG. 5 is a more detailed flowchart of step 120 of the flowchart of FIG. 1 in accordance with an embodiment of the present invention.

FIG. 5 is a more detailed flowchart of step 120 of the flowchart of FIG. 1. A first step 121 includes depositing one or more layers of material over the flexible substrate. In one embodiment, the layers of material include a bottom metal, a diode layer, and a switch layer. A second step 122 includes forming a 3-dimensional (3D) structure over the layers of material. In one embodiment, the 3D structure is an imprint polymer and is generated by utilizing a stamping tool. A method for utilizing a stamping tool to generate a 3D pattern in a layer of material is described in a patent application Ser. No. 10/184,587 entitled "A Method and System for Forming a Semiconductor Device" which is herein incorporated by reference. A final step 123 includes patterning the at least one material in accordance with the desired characteristics of the plurality of thin-film devices.

Once the 3D pattern is formed in the imprint polymer, the resulting structure can be implemented in the formation of a variety of semiconductor devices. Accordingly, the structure is particularly useful in the formation of cross-point memory arrays.

Cross-point Arrays

Preferably, the cross-point memory array includes two layers of orthogonal sets of spaced parallel conductors arranged with a semiconductor layer there between. The two sets of conductors form row and column electrodes overlaid in such a manner that each of the row electrodes intersects each of the column electrodes at exactly one place.

Figure 6:
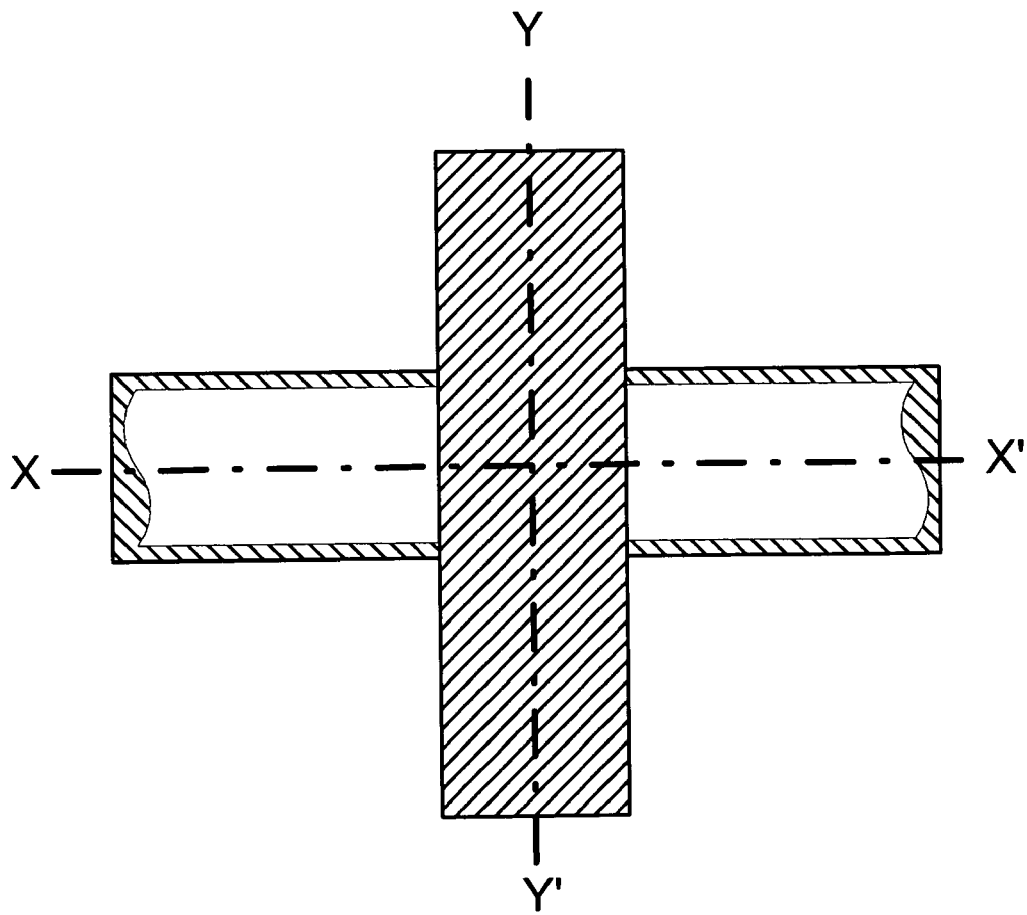
FIG. 6 is an illustration of a cross-point element in accordance with an embodiment of the present invention.

For a more detailed understanding of a cross-point array, please refer now to FIG. 6. FIG. 6 is an illustration of a single element of a cross-point array 600. At each of the intersections, a connection is made between the row electrode 610 and column electrode 620 through a semiconductor layer 630 which acts in the manner of a diode and a fuse in series. The diodes in the array are all oriented so that if a common potential is applied between all the row electrodes and all the column electrodes then all the diodes will be biased in the same direction. The fuse element may be realized as a separate element that will open-circuit when a critical current is passed there through or it may be incorporated in the behavior of the diode.

One of ordinary skill in the art will readily recognize that the above-described cross-point arrays could be utilized in the formation of a variety of semiconductor devices including but not limited to, resistors, capacitors, diodes, fuses, anti-fuses, etc.

Figure 7:
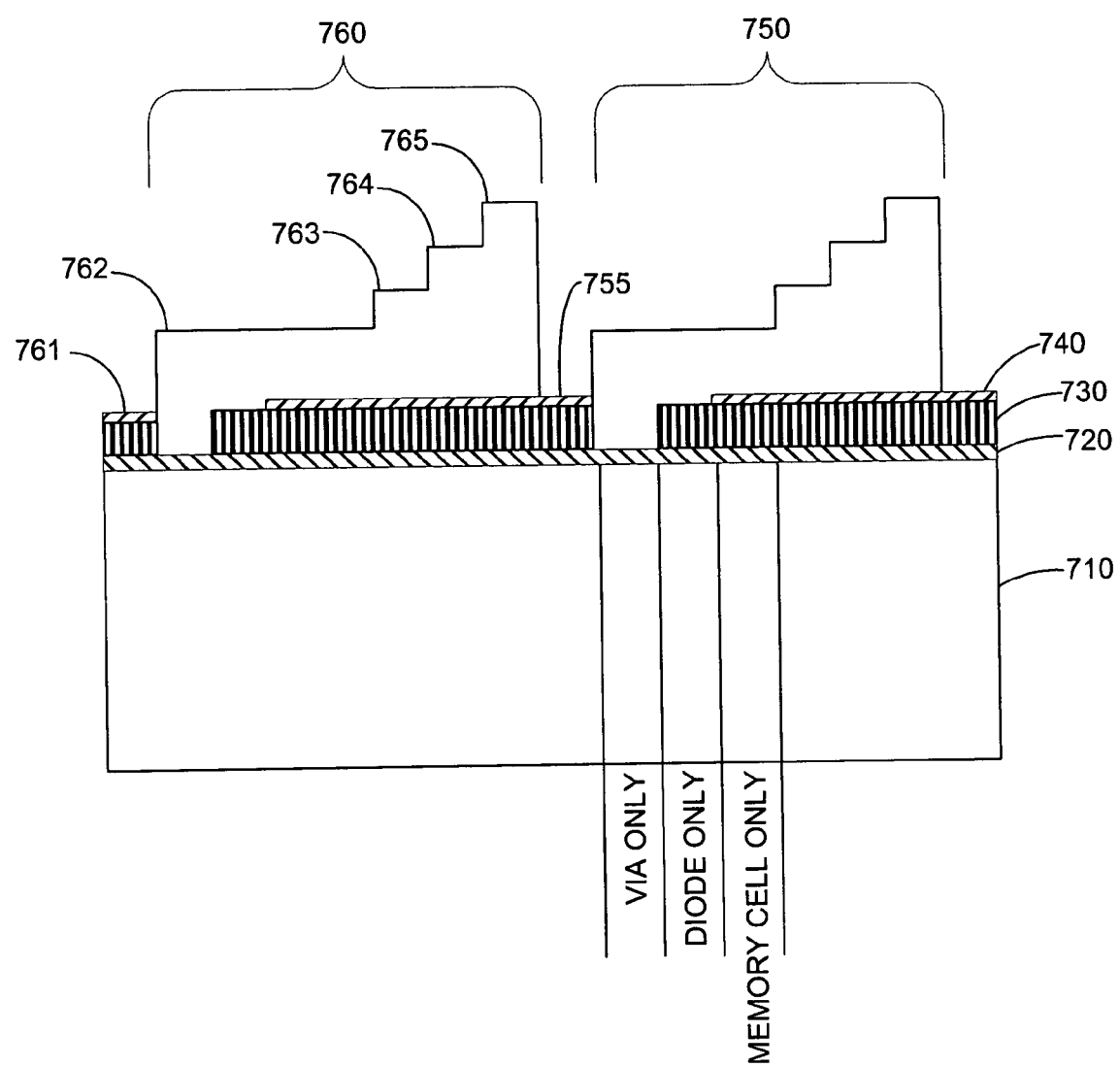
FIG. 7 shows a perspective view of a structure in accordance with an embodiment of the present invention.

FIG. 7 shows a perspective view of a structure in accordance with an embodiment. The structure 700 includes a flexible substrate 710, a bottom metal layer 720, a diode layer 730, a switch layer 740 and two sections of an embossed 3D polymer mask 750, 760. Each embossed polymer mask section 750, 760 incorporates all of the features needed to generate the structures required to create a PIRM array: regions with no thin films, patterned bottom metal lines, patterned top metal lines, insulated crossovers, top metal to bottom metal connections (vias), crosspoint diodes, and crosspoint memory cells. Additionally, five discrete step heights 761, 762, 763, 764 765 can be seen. A thin (~100 nm) polymer residue 755 may bridge the spaces between the two embossed polymer mask sections 750, 760. Furthermore, the vertical separation between adjacent mask levels is on the order of 0.5 to 1.0 micron.

In an embodiment, the flexible substrate 710 is a polyimide material. The bottom metal layer 720 can be one or more layers of metals or other conductive materials including conductive oxides or organic materials. The diode layer 730 can be a thin film silicon PIN diode. The switch layer 740 can be an amorphous silicon layer antifuse wherein a metallic barrier is between the amorphous silicon layer antifuse and the underlying diode. Alternatively, the switch layer may be an organic polymer fuse. The embossed polymer mask sections 750, 760 are made of a photo curable polymer material or the like.

Figure 8:
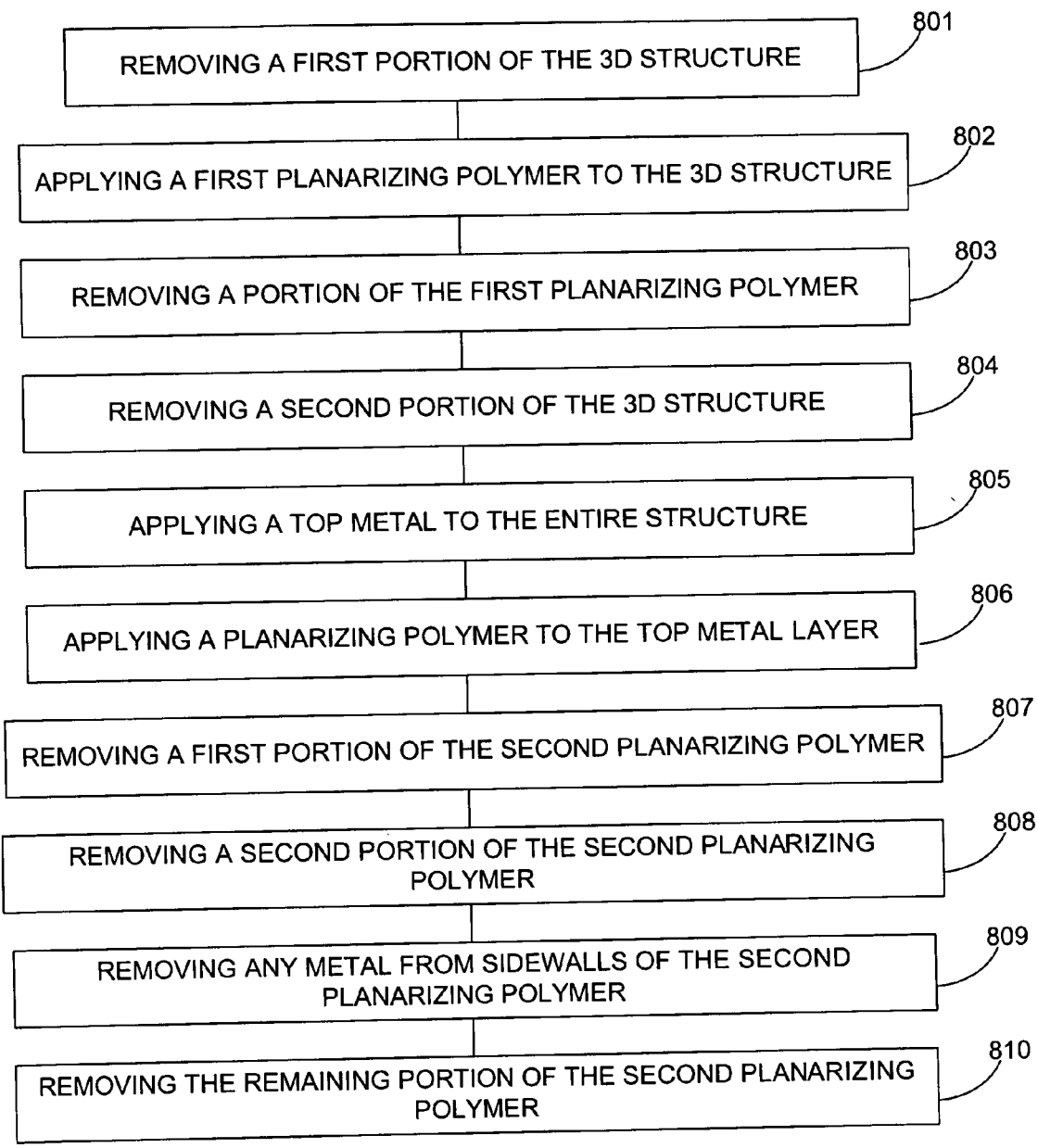
FIG. 8 shows a process for forming a plurality of thin-film devices in accordance with an embodiment of the present invention.

FIG. 8 shows a process for forming a plurality of thin-film devices in accordance with one embodiment. For illustrative purposes, FIGS. 8(a)–8(g) of the resulting structure during the implementation of the process of FIG. 8.

Figure 8A:
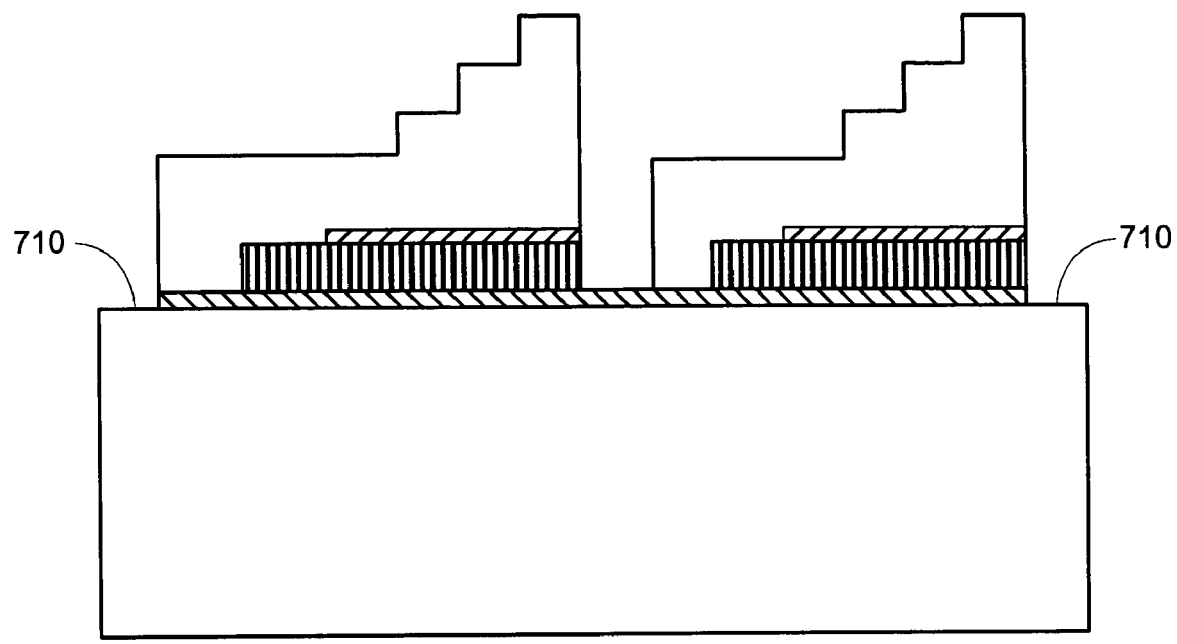
FIGS. 8(a)–8(g) of the resulting structure during the implementation of the process of FIG. 8 in accordance with an embodiment of the present invention.

A first step 801 involves removing a first portion of the 3D structure. This step includes etching any polymer residue and all of the thin films down to the substrate. A wet or dry etch process can be used here so long as the thin films are etched at a substantially greater rate than that of the polymer mask. FIG. 8(a) shows the resulting structure after the performance of step 801. As can be seen, a first portion of the flexible substrate 710 is exposed.

A second step 802 involves applying a first planarizing polymer to the 3D structure. Examples of planarization polymers are photo-resist, uv-curable polymers and spin-on glass. It is important that the 3D structure and the first planarizing polymer material are selected so that there is an etch process that can attack each material while leaving the other substantially unaffected. In an embodiment, re-planarization is performed in a roll-to-roll environment utilizing methods such as gravure coating. Gravure coating is widely used in the field commercial printing to transfer a thin well-controlled layer of material to a flexible web using a textured roller.

Figure 8B:
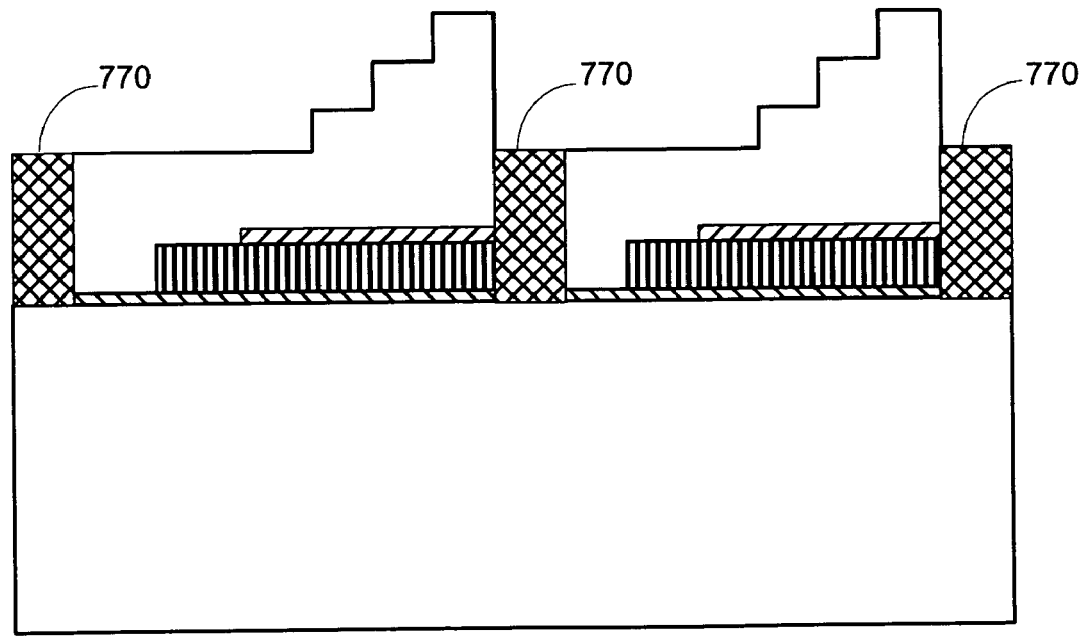

A third step 803 includes removing a portion of the first planarizing polymer. FIG. 8(b) shows the structure that includes a remaining portion of a first planarization polymer 770. In an embodiment, the first planarization polymer is removed by a dry etch process such as reactive ion etching (RIE) or ion-milling whereby the etching is selective with respect to the 3D polymer structure.

In an RIE process, the substrate is placed inside a reactor in which several gases are introduced. A plasma is struck in the gas mixture using an RF power source, breaking the gas molecules into ions and reactive species. The ions and reactive species react with the surface of the material being etched, forming another gaseous material. This is known as the chemical part of RIE etching. There is also a physical portion that is similar in nature to a sputtering deposition process.

If the ions have high enough energy, they can knock atoms out of the material to be etched without a chemical reaction. It is a very complex task to develop dry etch processes that balance chemical and physical etching, since there are many parameters to adjust. By changing the balance it is possible to influence the anisotropy of the etching, since the chemical part is isotropic and the physical part is highly anisotropic. Accordingly, RIE is capable of performing a very directional etch.

Ion-milling is a physical dry etching technique where a sample is exposed to a collimated beam of accelerated, mono-energetic inert ions thereby removing material due to ion impingement. The ion-milling systems typically incorporate a double-gridded ion source of the Kaufman type that supply acceleration voltages ranging from ~200 V to ~1.5 kV. Argon (p~2E-4 Torr) is typically used as the working gas. The sample is mounted on a rotating water-cooled stage that can be tilted with respect to the incoming Ar-ions.

Ion-milling is used for the fabrication of sub-micron gratings as well as for structuring samples incorporating very different materials such as metal/insulator/semiconductor-combinations since the etch rates of these materials are of comparable magnitude (e.g. GaAs: 80 nm/min, Au: 75 nm/min, silicon nitride: 25 nm/min, photoresist: ~20 nm/min for 500 eV-Ar ions). Accordingly, ion-milling provides a very flexible tool for the performance of directional etching.

Although ion-milling and RIE etch process have been described in conjunction with the above-disclosed embodiment, one of ordinary skill in the art will readily recognize that a variety of different etch processes could be utilized while remaining within the spirit and scope of the present invention.

Figure 8C:
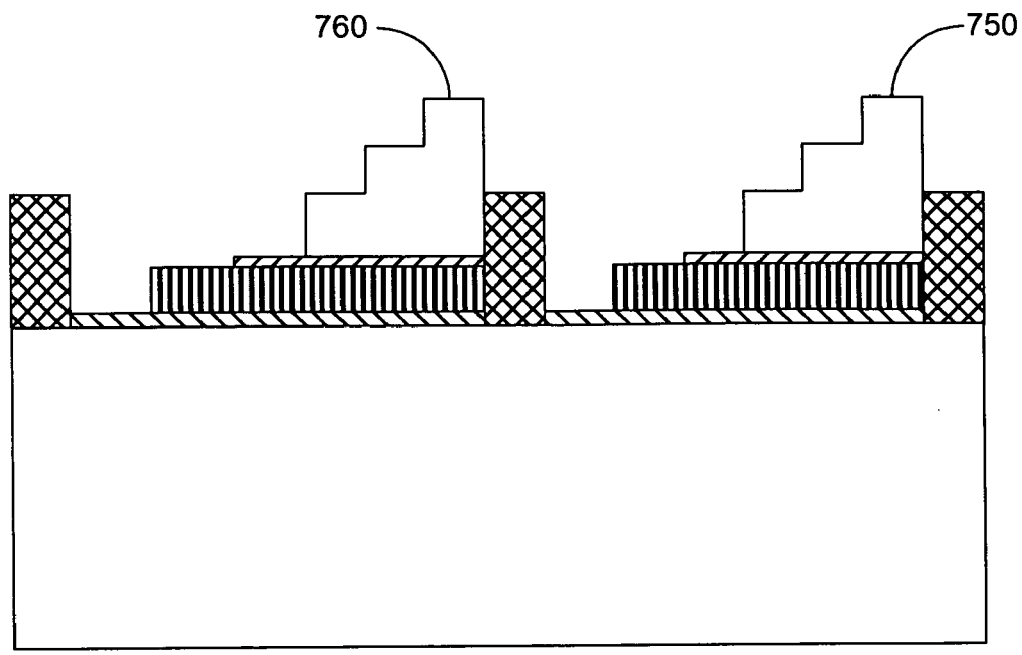

A fourth step 804 includes removing a second portion of the 3D structure. Here, one step height is removed from the 3D structure. FIG. 8(c) shows the structure after another step height has been removed from the 3D structure(s) 750, 760.

The exposed surfaces may be the bottom metal layer, the diode layer or the switch layer depending on the coarse patterning beneath the 3D structure. In an embodiment, this etching step has the selectivity to remove the embossed polymer but not the first planarization polymer.

It should be noted that in the case where the switch layer is a conductive polymer fuse, the switch layer may need to be protected by a non-organic barrier to prevent the switch layer from being etched away during the previous etch process. In this case, the non-organic barrier is etched away at this point in the process. This step is not necessary if a metallic barrier layer is utilized in conjunction with a switch layer made of amorphous silicon.

Figure 8D:
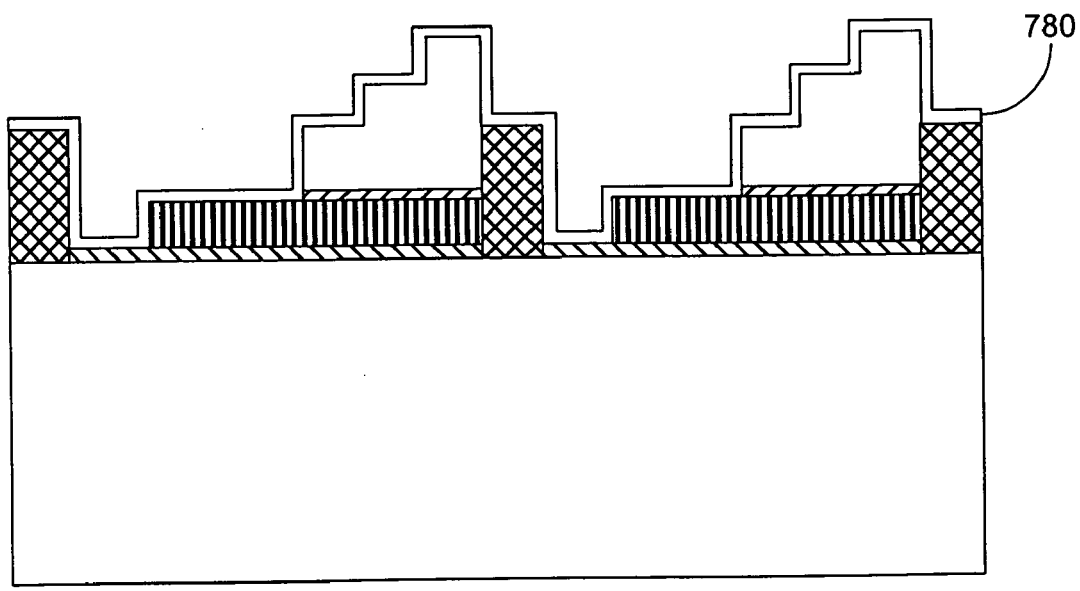

A fifth step 805 includes applying a top metal layer to the remaining portion of the structure. FIG. 8(d) shows the structure after the application of the top metal layer 780. Similar the bottom metal layer, the top metal layer 880 is one or more layers of metals, organics, dielectrics or semiconductors.

Figure 8E:
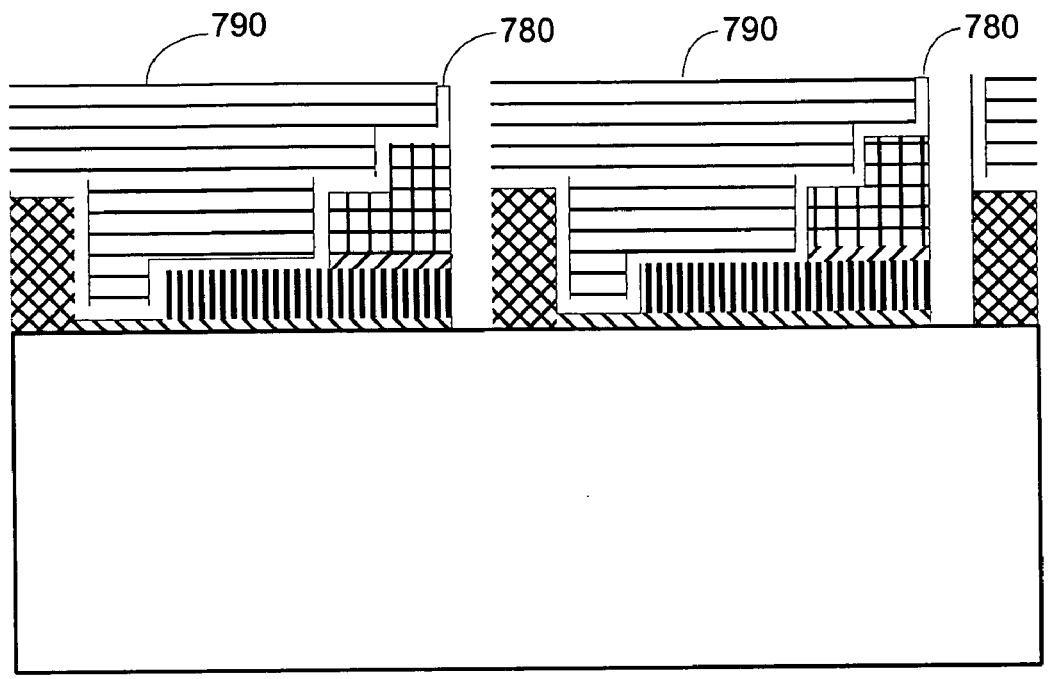

A next step 806 includes applying a second planarization polymer to the top metal layer. This polymer can be the same type as the first planarization polymer or a different polymer can be utilized. A next step 807 includes removing a first portion of the second planarizing polymer thereby exposing a first portion of the top metal layer. FIG. 8(e) shows the structure that includes a remaining portion of the second planarization polymer 790 and the exposed portion of the top metal layer 780. In an embodiment, the second planarization polymer is removed by a dry process such as RIE or ion milling whereby the etching is selective with respect to the top metal layer.

Figure 8F:
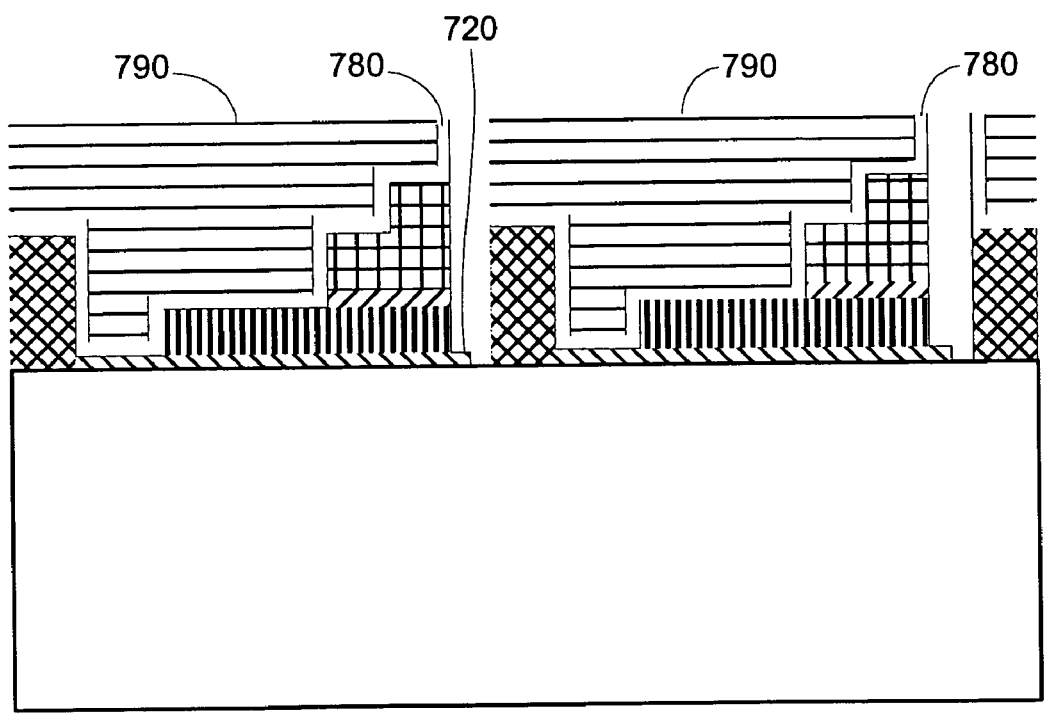

A next step 808 includes removing a second portion of the second planarizing polymer thereby exposing another portion of the top metal. FIG. 8(f) shows the structure that includes a remaining portion of the second planarization polymer 790 and another exposed portion of the top metal layer 780. As can be seen in FIG. 8(f), a portion of the switch layer 720 is also exposed.

A next step 809 includes removing any metal from the sidewalls of the second planarization polymer. In an embodiment, this etching step has the selectivity to remove the top metal layer but not the second planarization polymer or the substrate.

Figure 8G:
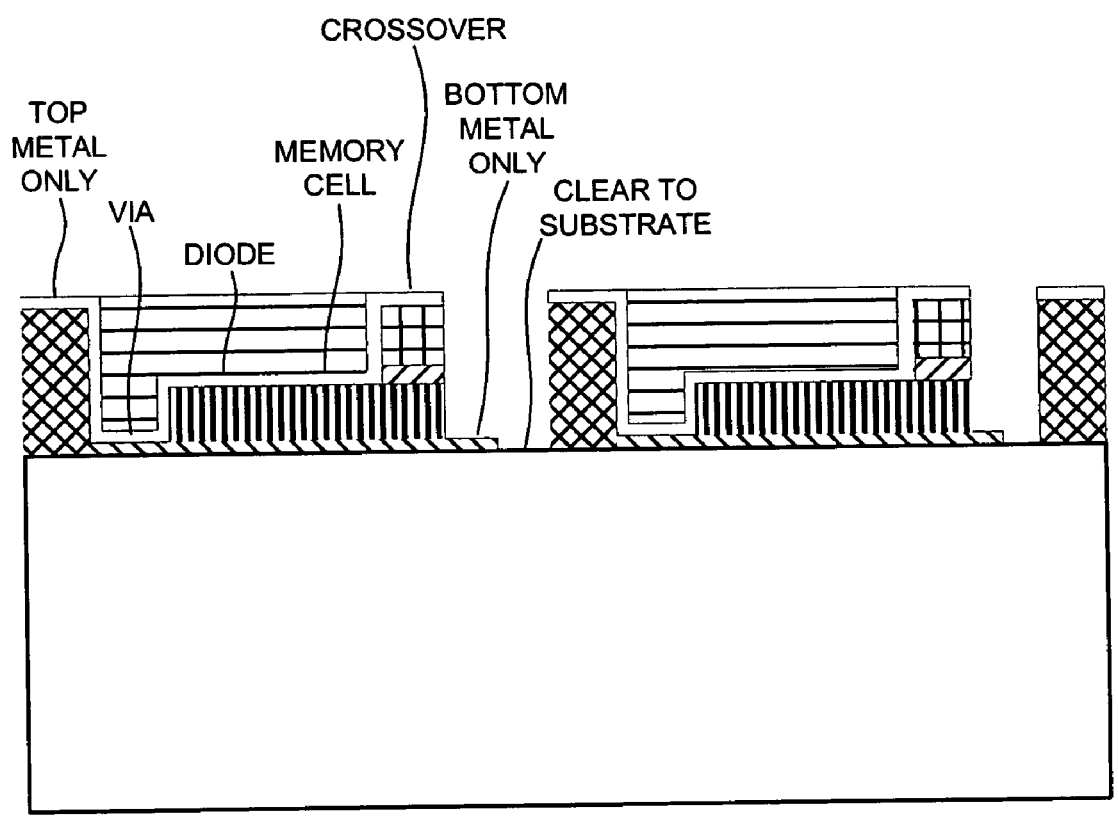

A final step 810 includes removing the remaining portion of the second planarization polymer. FIG. 8(g) shows the structure including the complete lexicon of thin-film elements utilized in the manufacturing of a PIRM array: top metal only, via, crosspoint diode, crosspoint memory cell, crossover (electrical connection isolation provided by embossing polymer) bottom metal only and exposed substrate. It should be noted that although the crossover is shown over an area with a memory cell, the crossover could have been deposited just as well over a diode only area or a bottom metal only area.

Figure 9:
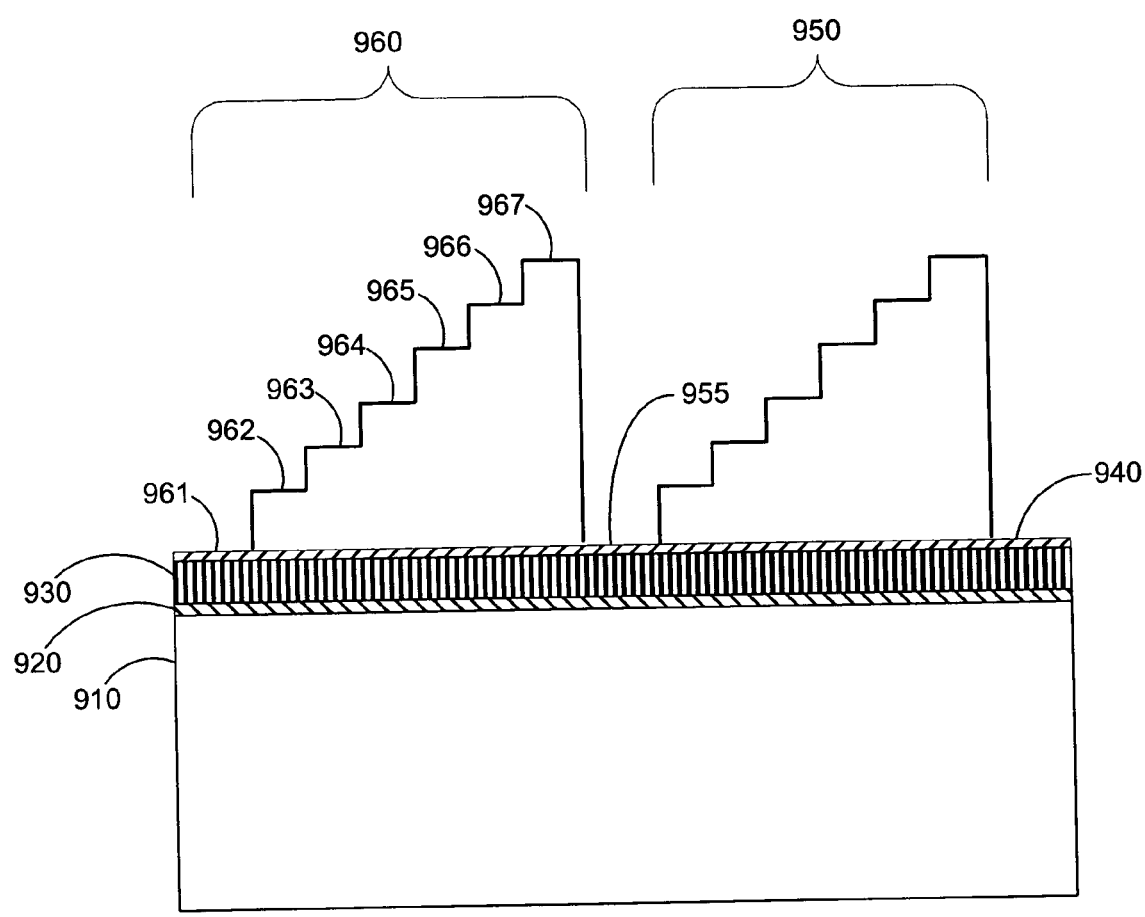
FIG. 9 shows a perspective view of a structure in accordance with another embodiment of the present invention.

FIG. 9 shows a perspective view of a structure in accordance with another embodiment. The structure 900 includes a flexible substrate 910, a bottom metal layer 920, a diode layer 930, a switch layer 940 and two sections of an embossed 3D polymer mask 950, 960. Each embossed polymer mask section 950, 960 incorporates all of the features needed to generate the structures required to create a PIRM array: regions with no thin films, patterned bottom metal lines, patterned top metal lines, insulated crossovers, top metal to bottom metal connections (vias), crosspoint diodes, and crosspoint memory cells.

Additionally, seven discrete step heights 961, 962, 963, 964, 965, 966, 967 can be seen. A thin (~100 nm) polymer residue 955 may bridge the spaces between the two embossed polymer mask sections 950, 960. Furthermore, the vertical separation between adjacent mask levels is on the order of 0.5 to 1.0 micron.

Similar to the above-described embodiment, the flexible substrate 910 is a polyimide material. The bottom metal layer 920 can be one or more layers of metals or other conductive materials including conductive oxides or organic materials. The diode layer 930 can be a thin film silicon PIN diode. The switch layer 940 can be an amorphous silicon layer antifuse wherein a metallic barrier is between the amorphous silicon layer antifuse and the underlying diode. Alternatively, the switch layer may be an organic polymer fuse. The embossed polymer mask sections 950, 960 are made of a photo curable polymer material or the like.

Figure 10:
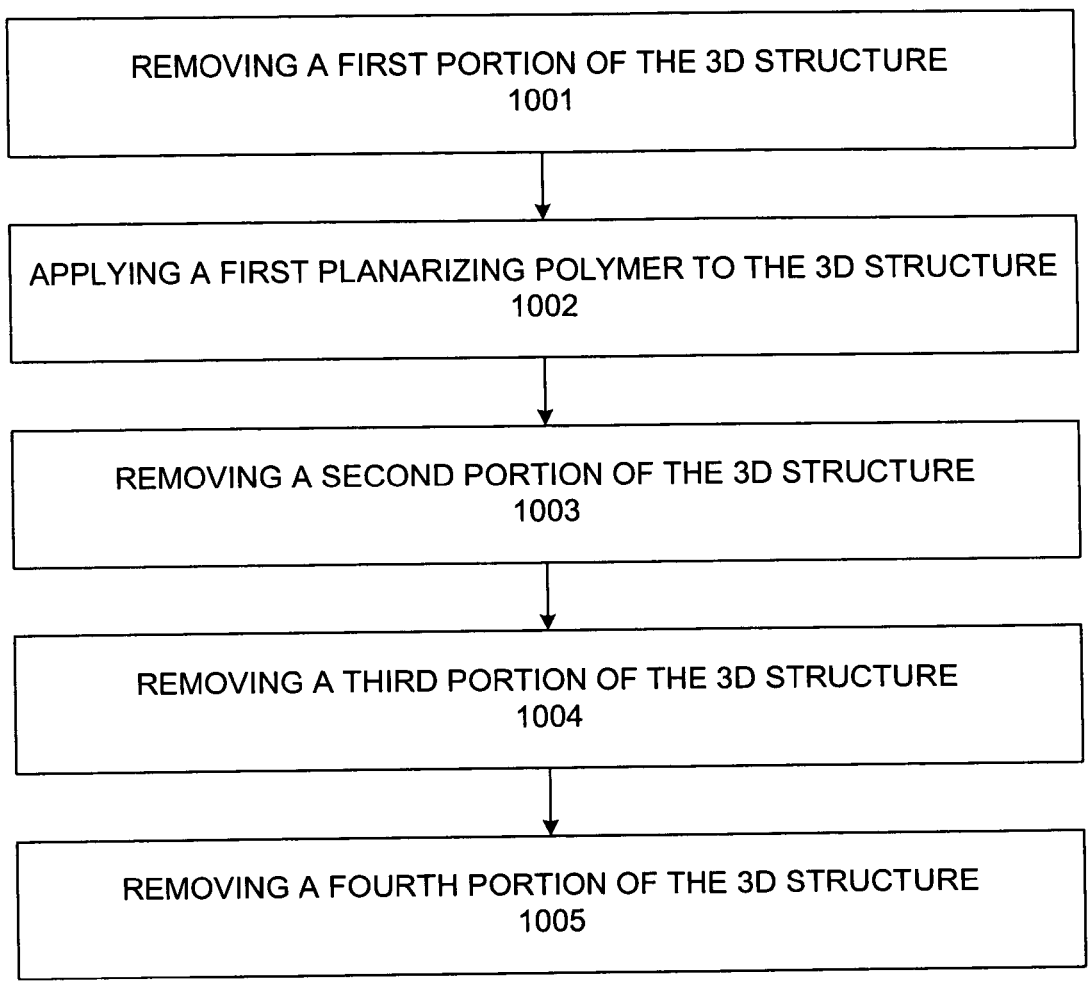
FIG. 10 shows a process for forming a plurality of thin-film devices in accordance with another embodiment of the present invention.

FIG. 10 shows a process for forming a plurality of thin-film devices in accordance with one embodiment. For illustrative purposes, FIGS. 10(a)–10(e) of the resulting structure during the implementation of the process of FIG. 10.

Figure 10A:
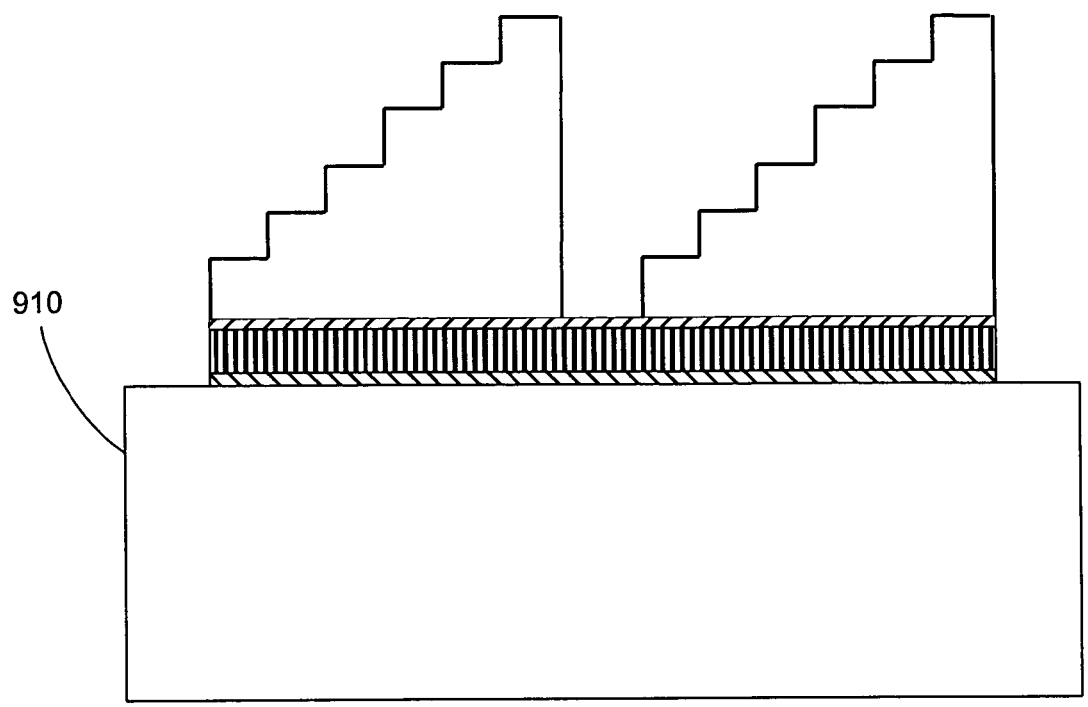
FIGS. 10(a)–10(e) of the resulting structure during the implementation of the process of FIG. 10 in accordance with an embodiment of the present invention.

A first step 1001 involves removing a first portion of the 3D structure. This step includes etching any polymer residue and all of the thin films down to the substrate. A wet or dry etch process can be used here so long as the thin films are etched at a substantially greater rate than that of the polymer mask. FIG. 10(a) shows the resulting structure after the performance of step 1001. As can be seen, a first portion of the flexible substrate 910 is exposed.

Figure 10B:
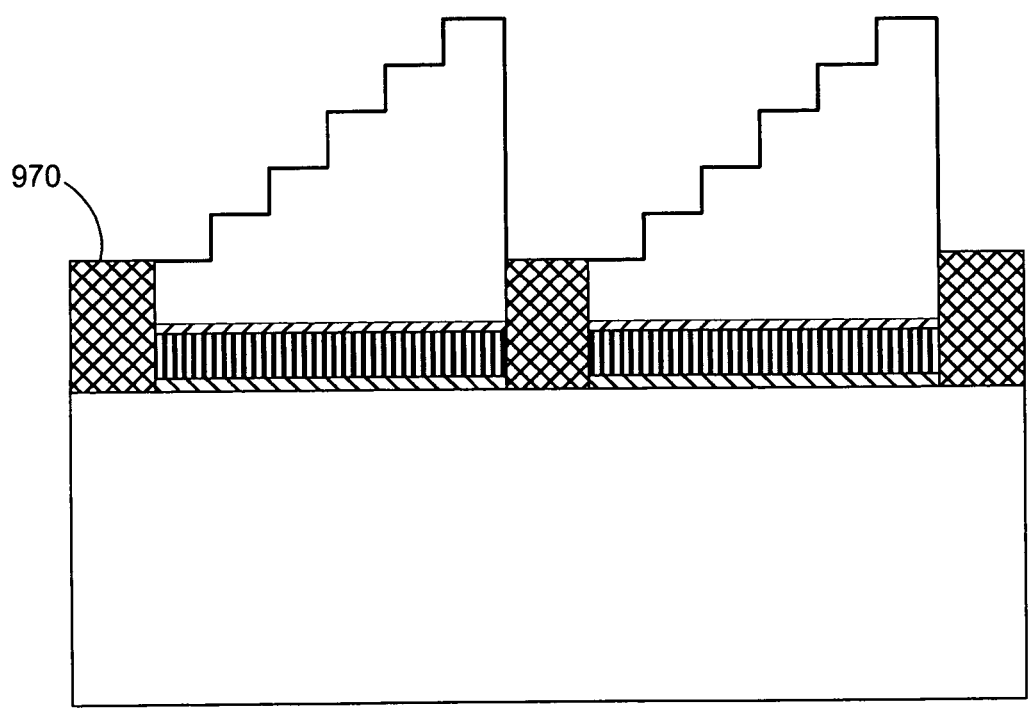

A second step 1002 involves applying a first planarizing polymer to the 3D structure. Examples of planarization polymers are photo-resist, uv-curable polymers and spin-on glass. It is important that the 3D structure and the first planarizing polymer material are selected so that there is an etch process that can attack each material while leaving the other substantially unaffected. In an embodiment, re-planarization is performed in a roll-to-roll environment utilizing methods such as gravure coating. FIG. 10(b) shows the structure after the application of the first planarization polymer 970.

Figure 10C:
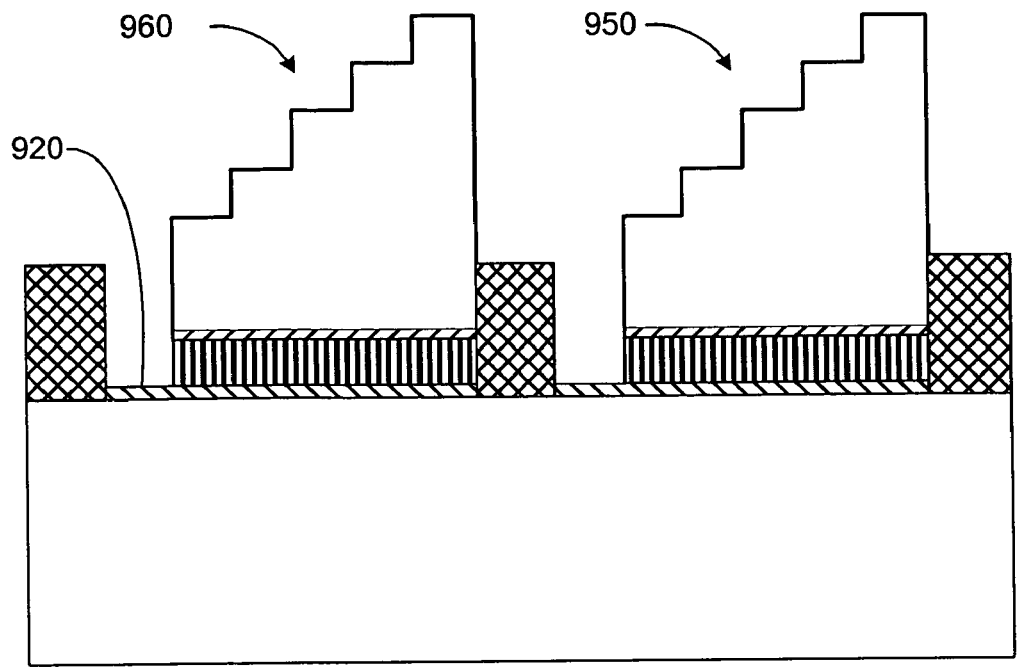

A third step 1003 includes removing a second portion of the 3D structure. Here, one step height is removed from the 3D structure. FIG. 10(c) shows the structure after another step height has been removed from the 3D structure(s) 950, 960. The exposed surfaces may be the bottom metal layer, the diode layer or the switch layer depending on the coarse patterning beneath the 3D structure. Here, the exposed surface is the bottom metal layer 920. In an embodiment, this etching step has the selectivity to remove the embossed polymer but not the first planarization polymer.

Figure 10D:
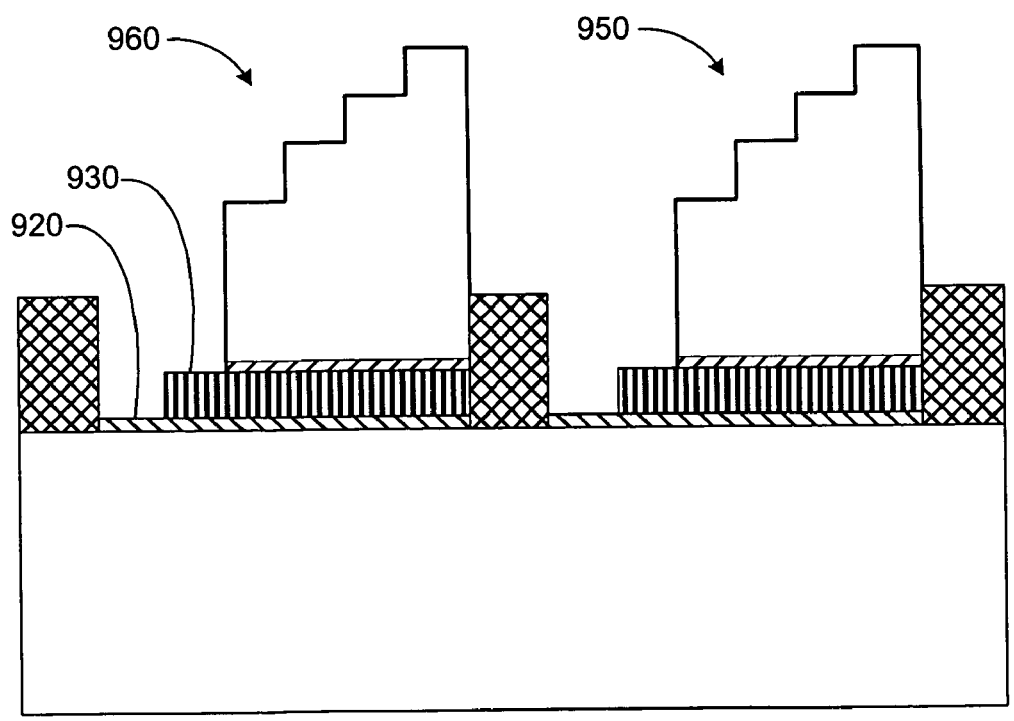

A fourth step 1004 includes removing a third portion of the 3D structure. Here, another step height is removed from the 3D structure. FIG. 10(d) shows the structure after another step height has been removed from the 3D structure(s) 950, 960. The exposed surface is the diode layer 930. In an embodiment, this etching step is anisotropic and has the selectivity to remove the embossed polymer but not the first planarization polymer.

Figure 10E:
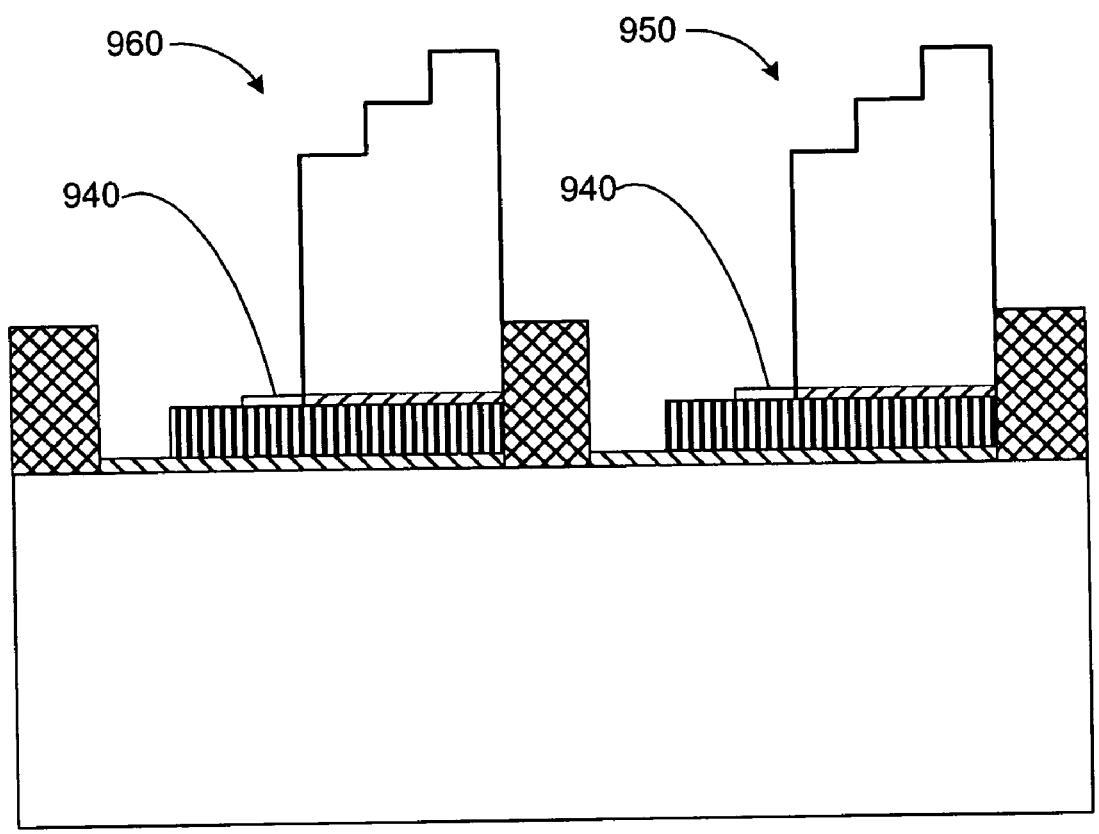

A fifth step 1005 includes removing a fourth portion of the 3D structure. Here, another step height is removed from the 3D structure. FIG. 10(e) shows the structure after another step height has been removed from the 3D structure(s) 950, 960. The exposed surface here is the switch layer 940. In an embodiment, this etching step is anisotropic and has the selectivity to remove the embossed polymer but not the first planarization polymer. The remaining steps in this process mirror steps 805–810 of the process depicted in FIG. 8.

Varying embodiments of the method and system provide a coarse patterning step to be utilized in conjunction with a self-aligned imprint lithography (SAIL) process in order to form a plurality of thin-film elements on a flexible substrate. Consequently, full electrical isolation of the thin-film elements is achieved regardless of the structures thereof. Additionally, by providing a coarse patterning step in conjunction with the SAIL process, the number of discrete heights employed by the associated embossing mask can be significantly reduced thereby reducing the number of mask mastering and etching steps in the overall process.

Without further analysis, the foregoing so fully reveals the gist of the present invention that others can, by applying current knowledge, readily adapt it for various applications without omitting features that, from the standpoint of prior art, fairly constitute essential characteristics of the generic or specific aspects of this invention. Therefore, such applications should and are intended to be comprehended within the meaning and range of equivalents of the following claims. Although this invention has been described in terms of certain embodiments, other embodiments that are apparent to those of ordinary skill in the art are also within the scope of this invention, as defined in the claims that follow.

What is claimed:

1. A method of forming a plurality of thin-film elements comprising:
   coarsely patterning at least one thin-film material on a flexible substrate with an additive process; and
   forming a plurality of thin-film elements on the flexible substrate with a self-aligned imprint lithography (SAIL) process.

2. The method of claim 1 wherein coarsely patterning at least one thin-film material comprises:
   patterning the at least one thin-film material with a subtractive process.

3. The method of claim 1 wherein forming a plurality of thin-film elements on the flexible substrate with a self-aligned imprint lithography (SAIL) process comprises:
   depositing at least one material over the flexible substrate;
   forming a 3D structure over the at least one material; and
   patterning the at least one material in accordance with desired characteristics of the plurality of thin-film elements.

4. The method of claim 1 wherein forming a plurality of thin-film elements on the flexible substrate with a self-aligned imprint lithography (SAIL) process comprises:
   depositing a planarization material.

5. The method of claim 1 wherein the plurality of thin-film elements comprises at least one of a via, a diode, an insulated crossover and a memory cell.

6. The method of claim 1 wherein the additive process employs shadow masking techniques to pattern the at least one thin-film material in a coarse fashion.

7. The method of claim 1 wherein the additive process employs inkjet printing to pattern the at least one thin-film material in a coarse fashion.

8. The method of claim 2 wherein the subtractive process employs screen print masks to pattern the at least one thin-film material in a coarse fashion.

9. The method of claim 2 wherein the subtractive process employs roll-to-roll photolithography to pattern the at least one thin-film material in a coarse fashion.

10. The method of claim 3 wherein the 3D structure comprises of a polymer material.

11. The method of claim 3 wherein forming a 3D structure over the at least one material comprises: imprinting a polymer over the at least one material; and forming a 3D pattern in the polymer.

12. The method of claim 3 wherein the 3D structure comprises 4 discrete vertical heights.

13. The method of claim 4 wherein the planarization material comprises at least one of a photo-resist, a UV-curable polymers and a spin-on glass.

14. The method of claim 12 wherein depositing at least one material comprises:
   depositing a bottom metal layer on the patterned flexible substrate;
   depositing a diode material in contact with the bottom metal layer; and depositing a switch layer.

15. The method of claim 14 further comprising:
   removing a first portion of the 3D structure;
   applying a first planarizing polymer in contact with the 3D structure;
   etching the first planarizing polymer; removing a second portion of the 3D structure;
   applying a top metal;
   applying a second planarizing polymer;
   performing a first etch of the second planarizing polymer thereby exposing a first portion of the top metal;
   performing a second etch of the second planarizing polymer thereby exposing a second portion of the top metal;
   removing any metal from a sidewall of the second planarizing polymer; and
   removing a portion of the second planarizing polymer.

16. The method of claim 15 wherein the first planarizing polymer is capable of being selectively removed with respect to the polymer.

17. The method of claim 15 wherein the first planarizing polymer is the same as the second planarizing polymer.

18. The method of claim 15 further comprising:
   forming a PIRM array.

* * * * *

UNITED STATES PATENT AND TRADEMARK OFFICE
CERTIFICATE OF CORRECTION

PATENT NO. : 7,195,950 B2 Page 1 of 1
APPLICATION NO. : 10/895584
DATED : March 27, 2007
INVENTOR(S) : Taussig It is certified that error appears in the above-identified patent and that said Letters Patent is hereby corrected as shown below:

On the Title page, in Item (75), in "Inventors", in column 1, line 2, after "(US)" insert -- ; Ping Mei, Palo Alto, CA (US); William Riis Hamburgen, Palo Alto, CA (US) --.

In column 5, line 43, after "thin" delete "(-100 nm)" and insert -- (~100 nm) --, therefor.

Signed and Sealed this

Third Day of November, 2009

David J. Kappos
*Director of the United States Patent and Trademark Office*